(12) United States Patent
Cruz et al.

(10) Patent No.: US 7,476,960 B2
(45) Date of Patent: Jan. 13, 2009

(54) SYSTEM AND METHOD FOR IMPROVED AUTO-BOATING

(75) Inventors: Mark Gerald M Cruz, Baguio (PH); Jerry G Cayabyab, Baguio (PH); Edward R De la Rosa, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 292 days.

(21) Appl. No.: 11/537,822

(22) Filed: Oct. 2, 2006

(65) Prior Publication Data

US 2007/0035034 A1 Feb. 15, 2007

Related U.S. Application Data

(62) Division of application No. 10/724,325, filed on Nov. 21, 2003, now Pat. No. 7,127,794.

(51) Int. Cl.
*H01L 23/02* (2006.01)
*A47G 19/08* (2006.01)

(52) U.S. Cl. .............. 257/678; 414/788; 414/935; 414/936; 414/940; 228/41.7; 211/41.18

(58) Field of Classification Search ......... 257/678–787, 257/98, 99, 660, E23.001–E23.194; 228/47.1; 211/41.18; 224/114, 41.1; 414/935–940
See application file for complete search history.

(56) References Cited

U.S. PATENT DOCUMENTS

| 5,275,326 | A | * | 1/1994 | Fiedler ................... 228/47.1 |
| 5,695,331 | A | | 12/1997 | Nutter et al. |
| 6,284,572 | B1 | | 9/2001 | Cantillep et al. |
| 6,359,336 | B1 | | 3/2002 | Cantillep et al. |
| 6,581,278 | B2 | | 6/2003 | Kay |

FOREIGN PATENT DOCUMENTS

| JP | 3-25925 | * | 2/1991 | ............ 414/935 |
| JP | 2001148390 A | | 5/2001 | |

OTHER PUBLICATIONS

"Advanced Module Packaging Method" Salmon, P.C.,; Quality Electronic Design, 2003, Proceedings, Fourth International Symposium on Mar. 24-26, 2003; pp. 223-228.

* cited by examiner

*Primary Examiner*—Jasmine J Clark
(74) *Attorney, Agent, or Firm*—Yingsheng Tung; Wade J. Brady, III; Frederick J. Telecky, Jr.

(57) ABSTRACT

According to one embodiment of the invention, a method for auto-boating includes supporting a tape substrate having first and second end portions on a boat, sandwiching the first and second end portions between respective ones of a pair of end sleeves and the boat, coupling a boat clip to the boat, and removing the end sleeves from between the first and second end portions and the boat clip.

8 Claims, 2 Drawing Sheets

SYSTEM AND METHOD FOR IMPROVED AUTO-BOATING

This is a divisional of application Ser. No. 10/724,325 filed Nov. 21, 2003.

TECHNICAL FIELD OF THE INVENTION

This invention relates generally to the field of integrated circuit packaging and, more specifically, to a system and method for improved auto-boating.

BACKGROUND OF THE INVENTION

Because of the sheer volume of integrated circuits in the marketplace, packaging of integrated circuits in a manner that is cost-effective with high yield is important for semiconductor manufacturers in order that they can be competitive in the marketplace. One important process in the fabrication of integrated circuits is the die attach process. Because of the ever decreasing thickness of some substrates, such as tape substrates, the die attach process becomes even more important because of the challenges present when attaching die to these types of substrates.

The auto-boating process, which sandwiches a tape substrate between a boat and a clip, greatly enhances the die attach process for tape substrates. However, since the clip holds down only a very small strip of the substrate along its edges, the possibility of the substrate edges getting jammed with the clip windows at the ends of the clip is high because of the coiling effect when placing a tape substrate on a boat. This leads to substrate bowing and warping along its edges, which means that the integrated circuit dies formed along the edges of the tape substrate may have to be scrapped, which hurts yield.

SUMMARY OF THE INVENTION

According to one embodiment of the invention, a method for auto-boating includes supporting a tape substrate having first and second end portions on a boat, sandwiching the first and second end portions between respective ones of a pair of end sleeves and the boat, coupling a boat clip to the boat, and removing the end sleeves from between the first and second end portions and the boat clip.

Some embodiments of the invention provide numerous technical advantages. Other embodiments may realize some, none, or all of these advantages. For example, a pair of end sleeves are utilized in an auto-boating process to hold the ends of the tape substrate flat against the boat while the boat clip is pressed down over the tape substrate. This substantially eliminates the possibility of contact between the edges of the tape substrate and the clip windows. Hence, any bowing/warping along the edges of the tape substrate is eliminated. This improved auto-boating process is a simple drop-in step that avoids having to change the length of the tape strip from which the tape substrate is formed.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 3D of the drawings, in which like numerals refer to like parts.

Figure 1:
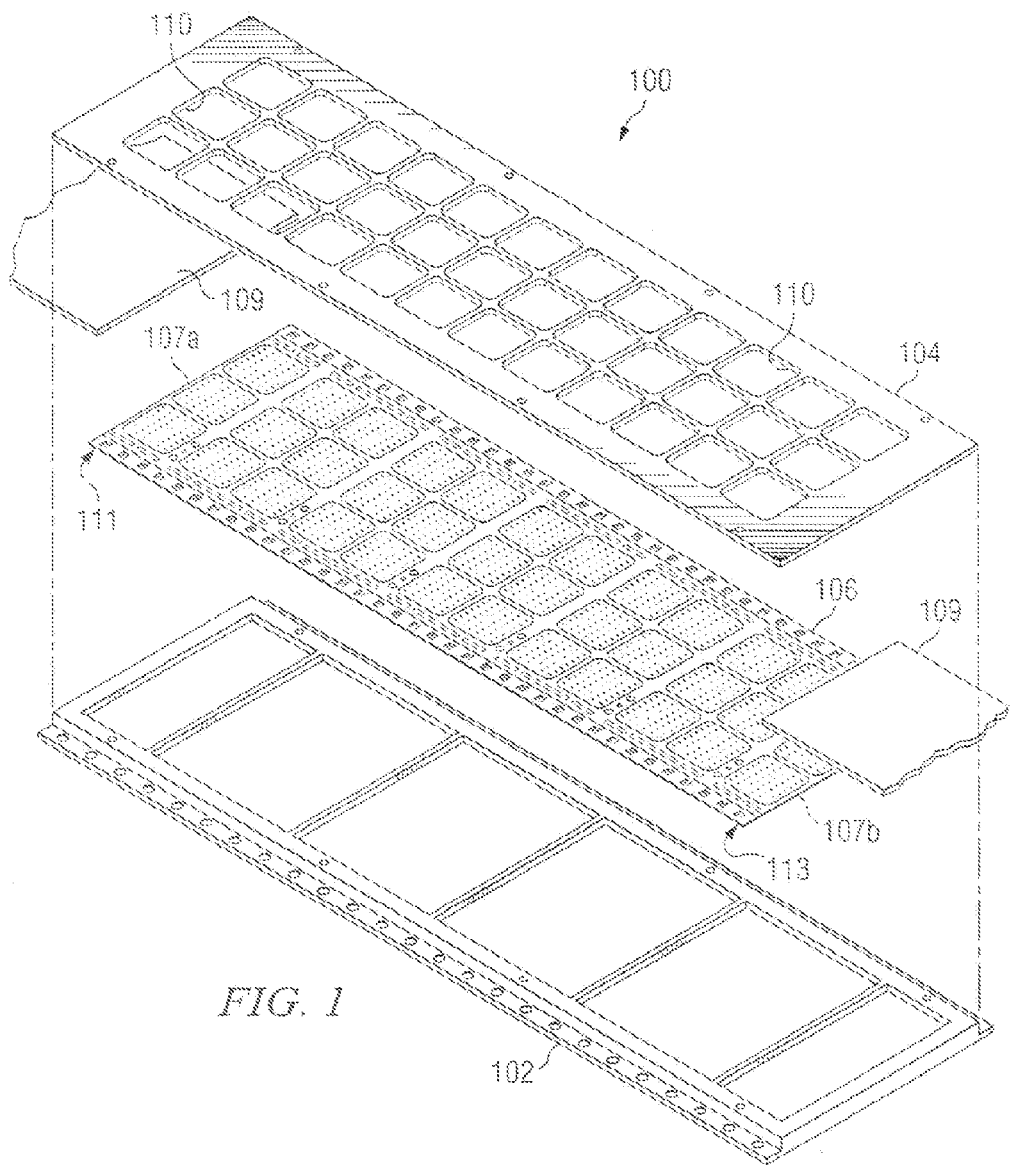
FIG. 1 is an exploded perspective view of a system used in auto-boating according to one embodiment of the present invention.

FIG. 1 is an exploded, perspective view of a system 100 utilized in an auto-boating process according to one embodiment of the present invention. The auto-boating process is well known in the integrated circuit fabrication industry. Hence, all details of such a process may not be fully described herein. Generally, system 100 is utilized in the fabrication of integrated circuits, such as ball grid arrays ("BGAs"). In the illustrated embodiment, system 100 includes a boat 102, a boat clip 104, a pair of end sleeves 109, and a tape substrate 106 having a plurality of die attach regions 108 in which integrated circuit die are coupled thereto in order to fabricate individual integrated circuits.

Generally, boat 102 is used as a carrier for tape substrate 106 during the fabrication of integrated circuits and boat clip 104 secures tape substrate 106 to boat 102. Boat clip 104 facilitates the die attach process for tape substrate 106 by including a plurality of windows 110 formed therein that expose die attach regions 108 on tape substrate 106. Both boat 102 and boat clip 104 may formed from any suitable material; however, boat 102 and boat clip 104 are typically formed from a suitable metal.

Because tape substrate 106 may be very thin in some embodiments, boat 102 and boat clip 104 are needed to secure tape substrate 106 in place so that integrated circuit die may be attached to tape substrate 106 in an accurate and cost-efficient manner. As a brief example of the fabrication process for integrated circuits utilizing system 100, integrated circuit die (not shown) are attached to respective die attach regions 108 on tape substrate 106, a suitable wire bonding process couples the integrate circuit die to the appropriate contacts on each die attach region 108, and then tape substrate 106 is transferred to the next assembly station so that a suitable encapsulation process may take place. After encapsulation, a suitable ball attach process is utilized to attach solder balls to the underside of a tape substrate 106 before the integrated circuits are singulated with a suitable singulation process.

Since tape substrate 106 receives integrated circuit die, it is important for die attach regions 108 of tape substrate 106 to be relatively planar without any bowing and/or warping before the integrated circuit die are attached thereto. Bowing and warping problems of die attach regions 108 proximate each end of tape substrate 106 has been discovered using prior auto boating systems. An example of such substrate bowing is illustrated in FIG. 2.

Figure 2:
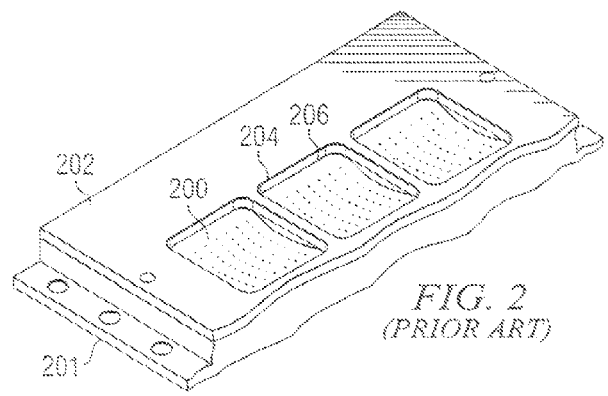
FIG. 2 illustrates the bowing of a prior art tape substrate being sandwiched between a boat and a boat clip.

Referring to FIG. 2, the bowing of prior art tape substrate 200 is illustrated. Tape substrate 200 is sandwiched between a boat 201 and a boat clip 202. Typically, the bowing problem occurs because a lateral edge 206 of tape substrate 200 contacts the edges of clip windows 204 formed in boat clip 202 as boat clip 202 is positioned over substrate 200 during the coupling of boat clip 202 to boat 201 that is supporting tape substrate 200. This is because after tape substrate 200 is placed on boat 201, tape substrate 200 is not totally flat and "coils" upward along its longitudinal edges to form a somewhat concave surface. As boat clip 202 is placed on top of tape substrate 200 in order to sandwich tape substrate 200 between boat 201 and boat clip 202, the possibility of lateral edge 206 getting jammed with clip windows 204 is very high. With reference to FIG. 1, the present invention addresses this problem, in one embodiment, by providing end sleeves 109 to hold down end portions 111, 113 of tape substrate 106 one boat 102 before boat clip 104 is placed over tape substrate 106 and coupled to boat 102. This counteracts the coiling effect and eliminates the possibility of lateral edges 107a, 107b of tape substrate 106 getting jammed with clip windows 110. The utilization of end sleeves 109 is described in more detail below in conjunction with FIGS. 3A through 3D.

Figure 3A:
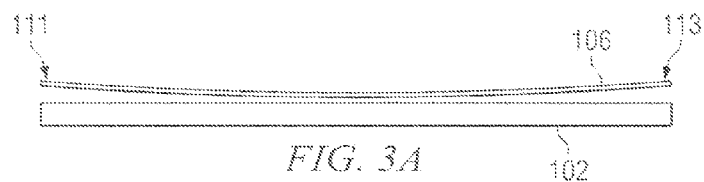
FIGS. 3A through 3D are elevation views of a simplified auto-boating process according to one embodiment of the present invention.

FIGS. 3A through 3D are longitudinal elevation views of a simplified auto-boating process according to one embodiment of the present invention. Referring to FIG. 3A, tape substrate 106 having end portions 111 and 113 is supported by boat 102. The slight curvature of tape substrate 106 is meant to illustrate the coiling effect that takes place when tape substrate 106 is placed on boat 102. As described above, this coiling effect has led to bowing and/or warping problems of die attach regions 108 proximate end portions 111 and 113 of tape substrate 106 in prior auto-boating systems. To prevent this, the present invention utilizes end sleeves 109 in a manner described below in conjunction with FIGS. 3B through 3D.

Figure 3B:

FIG. 3B illustrates end sleeves 109 sandwiching end portions 111 and 113 of tape substrate 102 between end sleeves 109 and boat 102. In one embodiment, end sleeves 109 are horizontally extended, as denoted by arrows 300, by automated machines to cover end portions 111 and 113. Any suitable width 302 of each end portion 111, 113 may be sandwiched between a respective end sleeve 109 and boat 102; however, in one embodiment, width 302 is between approximately two millimeters and six millimeters. In a more particular embodiment, width 302 is approximately four millimeters. The larger the width 302 is, the greater risk of damage of die attach regions 108 proximate end portions 111 and 113. Because lateral edges 107a, 107b are typically square edges, end sleeves 109 are generally rectangularly shaped.

Figure 3C:

FIG. 3C illustrates boat clip 104 being coupled to boat 102 while end sleeves 109 are holding down end portions 111 and 113 of tape substrate 106. Because boat clip 104 is coupled to boat 102 while end sleeves 109 are performing their function, end sleeves 109 preferably are formed from a relatively thin material. For example, a thickness 304 of end sleeves 109 is no more than 0.675 millimeters. Although boat clip 104 may be coupled to boat 102 in any suitable manner, typically boat clip 104 is magnetically coupled to boat 102. The coupling force between boat clip 104 and boat 102 is such that it is great enough to secure tape substrate 106 therebetween for subsequent attaching of integrated circuit die on die attach regions 108, yet small enough to be able to remove end sleeves 109 from therebetween.

Figure 3D:
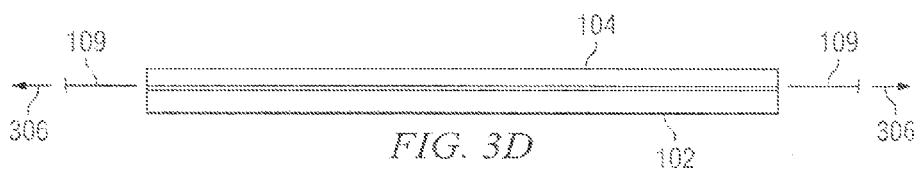

FIG. 3D illustrates the retraction of end sleeves 109 from between boat clip 104 and boat 102, as denoted by arrows 306. Because width 302 is relatively small, end sleeves may be easily removed from between boat clip 104 and boat 102 without damaging end portions 111 and 113 of tape substrate 106. Any suitable automated machine may function to retract or remove end sleeves 109 therefrom.

Thus, utilization of end sleeves 109 to hold down end portions 111 and 113 of tape substrate 106 as boat clip 104 is coupled to boat 102 eliminates the possibility of contact between lateral edges 107a and 107b of tape substrate 106 and clip windows of boat clip 104 to prevent substrate bowing and/or warping. Integrated circuit die may then be attached to die attach regions 108 without having to worry about any bowing and/or warping that may affect the quality and reliability of the completed integrated circuits.

Although embodiments of the invention and their advantages are described in detail, a person skilled in the art could make various alterations, additions, and omissions without departing from the spirit and scope of the present invention, as defined by the appended claims.

What is claimed is:

1. A system used in auto-boating, comprising:
   a boat;
   a tape substrate having first and second end portions configured to support the boat;
   a pair of end sleeves operable to sandwich respective ones of the first and second end portions between the end sleeves and the boat; and
   a boat clip configured to couple to the boat.

2. The system of claim 1, wherein the end sleeves are operable to horizontally extend toward and away from the tape substrate.

3. The system of claim 1, wherein the end sleeves are rectangularly shaped.

4. The system of claim 1, wherein the end sleeves have a thickness of no more than 0.675 millimeters.

5. The system of claim 1, wherein the end portions have a width of between approximately two millimeters and six millimeters.

6. The system of claim 1, wherein the end portions have a width of approximately four millimeters.

7. The system of claim 1, wherein the tape substrate is formed from polyimide.

8. The system of claim 1, wherein the boat clip is operable to magnetically couple to the boat.

* * * * *